(12) United States Patent
Watt

(10) Patent No.: US 6,272,033 B1
(45) Date of Patent: Aug. 7, 2001

(54) STATUS BITS FOR CACHE MEMORY

(75) Inventor: Simon Charles Watt, Swaffham Bulbeck (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/512,329

(22) Filed: Feb. 24, 2000

(30) Foreign Application Priority Data

Jun. 8, 1999 (GB) .................................................. 9913348

(51) Int. Cl.[7] .................................................. G11C 15/00
(52) U.S. Cl. ........................................ 365/49; 365/189.01
(58) Field of Search ................................ 365/49, 189.01, 365/230.01

(56) References Cited

U.S. PATENT DOCUMENTS

| | | | |
|---|---|---|---|
| 4,426,682 | 1/1984 | Riffe et al. | 364/200 |
| 5,475,849 | 12/1995 | Ando et al. | 395/800 |
| 5,539,894 | 7/1996 | Webber | 395/455 |
| 5,568,416 | * 10/1996 | Kawana et al. | 365/49 |
| 6,046,923 | * 4/2000 | Evans | 365/49 |

FOREIGN PATENT DOCUMENTS

| | | |
|---|---|---|
| 39 19 802 | 12/1989 | (DE) . |
| 195 16 949 | 2/1996 | (DE) . |
| WO 95/31783 | 11/1995 | (WO) . |

* cited by examiner

*Primary Examiner*—Vu A. Le
(74) *Attorney, Agent, or Firm*—Nixon & Vanderhye P.C.

(57) ABSTRACT

Data processing apparatuses provided comprising a memory operable to store a plurality of data words, each data word being associated with at least one status bit giving information regarding a status of said data word; a status bit store operable to store said status bits within a hierarchical relationship such that a combined status relating to a plurality of first level status bits at a first level within said hierarchical relationship is indicated by a second level status bit at a second level within said hierarchical relationship, said second level being higher in said hierarchical relationship than said first level; and status querying logic operative to determine a status of a data word within said memory by examining status bits within said status bit store starting at a top level within said hierarchical relationship and working down through said hierarchical relationship until a status bit is reached that indicates said status of said data word independently of any status bits lower in said hierarchical relationship. In this way a global or large-scale change to status bits may be made by modifying relatively few higher level status bits within the hierarchical relationship thereby achieving a high speed change with reduced levels of special purpose hardware being required.

18 Claims, 5 Drawing Sheets

STATUS BITS FOR CACHE MEMORY

BACKGROUND OF THE INVENTION

1. Field of the Invention

This invention relates to data processing systems. More particularly, this invention relates to data processing systems using cache memory that incorporates at least one status bit associated with each data word within the cache memory.

2. Description of the Prior Art

It is known to provide cache memories, such as that illustrated in FIG. 1 of the accompanying drawings, that include store 2 containing address TAGs for lines of data in a cache RAM memory 4. The cache RAM memory 4 is composed of a plurality of cache lines 6, each cache line 6 storing four data words. A plurality of valid and dirty bits 8 are associated with each cache line 6. Common types of status bits 8 are a valid bit 10 and a dirty bit 12. The valid bit 10 indicates whether that cache line is storing valid data, e.g. at startup each cache line 6 must be marked as storing invalid data. The dirty bit 12 indicates in the context of a write back cache architecture that at least one data word with that cache line 6 has been changed since it was read from the main memory and accordingly needs writing back to the main memory when that cache line 6 is flushed from or replaced within the cache. It will be seen that as a compromise between circuit area and the degree of fine control that can be achieved with the status bits 8, each cache line 6 has one valid bit 10 associated with it and one dirty bit 12 associated with it (this is the arrangement used in the majority of cache implementations). Thus, the four data words within a cache line 6 share these status bits 8.

In certain operational situations it is desirable to make global changes to the status bits 8 of all of the cache lines 6 of a cache system. As an example, upon system startup, following an MMU change or following a context switch, it is often necessary to flush the entire contents of the cache by marking all of the valid bits 10 of each cache line 6 as invalid. One way of doing this is to sequentially access each of the valid bits 10 and write it invalid. In a cache system that may contain thousands of cache lines 6, this operation can take thousands of processing cycles and significantly impact system performance. An alternative to sequentially and individually altering each of the status bits 8 is to apply a global change through special purpose hardware that is able to change the status bits in parallel. Whilst this can provide fast operation, it has the disadvantage of consuming circuit area for this special purpose hardware and typically requires to be custom designed for each implementation of a more generic system design.

SUMMARY OF THE INVENTION

The present invention is concerned with providing mechanisms for changing status bits at high speed, possibly as fast as one processing cycle, without having to provide custom hardware for the parallel access of all of the status bits.

Viewed from one aspect the present invention provides apparatus for data processing, said apparatus comprising:

(i) a memory operable to store a plurality of data words, each data word being associated with at least one status bit giving information regarding a status of said data word;

(ii) a status bit store operable to store said status bits within a hierarchical relationship such that a combined status relating to a plurality of first level status bits at a first level within said hierarchical relationship is indicated by a second level status bit at a second level with in said hierarchical relationship, said second level being higher in said hierarchical relationship than said first level; and (iii) status querying logic operative to determine a status of a data word within said memory by examining status bits within said status bit store starting at a top level within said hierarchical relationship and working down through said hierarchical relationship until a status bit is reached that indicates said status of said data word independently of any status bits lower in said hierarchical relationship.

The invention provides status bits arranged in a hierarchical relationship (having at least two levels) such that global or large-scale changes to the status of a plurality of data words within the memory may be made by changing relatively few status bits at the top or towards the top of the hierarchical relationship without having to individually change every status bit related to each data word for which the status is changing. In this way, the time taken to make global or large-scale changes to the status bits can be drastically reduced without the need to provide custom hardware for making large-scale change s in parallel to all of the status bits. It will be appreciated that many data words may share status bits. In some embodiments the hierarchy may be of valid bits and the data words to which these refer include, TAG values, data words, dirty bits and other status bits.

The status bits could represent a variety of different properties of the data words related to them. However, the invention is particularly suited to embodiments in which the status bits are valid bits indicative of validity of data words stored within the memory.

Valid bits are often subject to global or large-scale changes and so the invention is particularly useful in allowing these to be changed more rapidly and with reduced hardware cost.

It will be appreciated that at the lowest level within the hierarchical relationship an individual status bit could be provided for each data word. Thus, if the memory is a cache memory and a cache line stores four data words, then it would be possible to associate four separate valid bits with that cache line to indicate the validity of each individual data word. However, in preferred embodiments of the invention a lowest level status bit relates to a plurality of data words. This provides a satisfactory compromise between the granularity of fine control that can be achieved and the hardware resources required to provide the status bits.

More particularly, it is highly convenient to associate a lowest level status bit with all the data words within a cache row of the cache memory. In some embodiments a cache row may be considered to include its associated TAG values and dirty bits.

This arrangement has been found to work efficiently since cache accesses to and from the main memory typically take place on a cache-row-by-cache-row basis such that status information below the level of a cache row is rarely necessary due to the temporal and spatial locality that is in practice associated with most memory accesses.

The present invention suits itself to embodiments in which the status bits store includes a RAM memory storing status bit words formed of a plurality of status bits. The hierarchical relationship between these status bits and the status querying logic are such that the status bits towards the lower levels within the hierarchical relationship can be stored within RAM memory without significantly impacting performance and thereby gain the storage density advantages of RAM memory compared to custom latches or registers.

Storing the status bits within RAM memory allows them to be conveniently manipulated as status bit words that are accessed from the RAM memory.

In manipulating status bit words a typical operation will be a read-modify-write operation that is readily supported by existing data processing structures within many systems. Separate read and write operations may also be needed and in some RAM memories only read and write operations will be supported.

In contrast to the use of high-density RAM memory at the lowest levels within the status bits store, in preferred embodiments at least the highest level within the hierarchical relationship uses register bit circuits (D-Type) to store the status bits. Latch circuits can be very rapidly accessed and altered in response to predefined inputs or states, such as startup, MMU changes, context switches, etc., and accordingly provide rapid global or large-scale status changes with relatively little or no custom hardware.

The status bits stored within a latch are typically capable of being individually accessed and manipulated as compared with status bits stored within a RAM which are accessed and manipulated on a word-by-word basis.

In some embodiments the highest level within the hierarchical relationship may comprise a single status bit. In such circumstances, the entire status of the data words of a cache memory can be altered by the single change of this one status bit at the highest level.

In order to gain substantial advantages from the status bit store and status querying logic of the invention, it is highly desirable to arrange that global changes for the entire memory can be made by modifying only the highest level of the hierarchical relationship and that sufficient hardware support is provided that such a global change may be effected in a single processing cycle. This is particularly advantageous in the context of a cache memory.

It will be appreciated that whilst the global changing of status bits may be made using changes to fewer bits within such a hierarchical relationship, the setting of individual status bits starting from the lowest level might be thought to take longer as the changes would have to be reflected upwards throughout the hierarchical relationship. However, the invention recognizes that in the context of a cache memory, a cache fill operation typically is relatively slow and so the many status bit changes associated with cache fills in fact have sufficient time available to them to allow all of the necessary status bit changes within the hierarchical relationship to be made without impacting upon the overall speed of operation. Status bits may be changed in parallel further increasing efficiency.

Viewed from another aspect, the present invention provides a method of processing data, said method comprising the steps of:
 (i) storing a plurality of data words within a memory, each data word being associated with at least one status bit giving information regarding a status of said data word;
 (ii) storing said status bits within a hierarchical relationship such that a combined status relating to a plurality of first level status bits at a first level within said hierarchical relationship is indicated by a second level status bit at a second level within said hierarchical relationship, said second level being higher in said hierarchical relationship than said first level; and
 (iii) determining a status of a data word within said memory by examining status bits starting at a top level within said hierarchical relationship and working down through said hierarchical relationship until a status bit is reached that indicates said status of said data word independently of any status bits lower in said hierarchical relationship.

The above, and other objects, features and advantages of this invention will be apparent from the following detailed description of illustrative embodiments which is to be read in connection with the accompanying drawings.

DESCRIPTION OF THE PREFFERRED EMBODIMENTS

Figure 1:
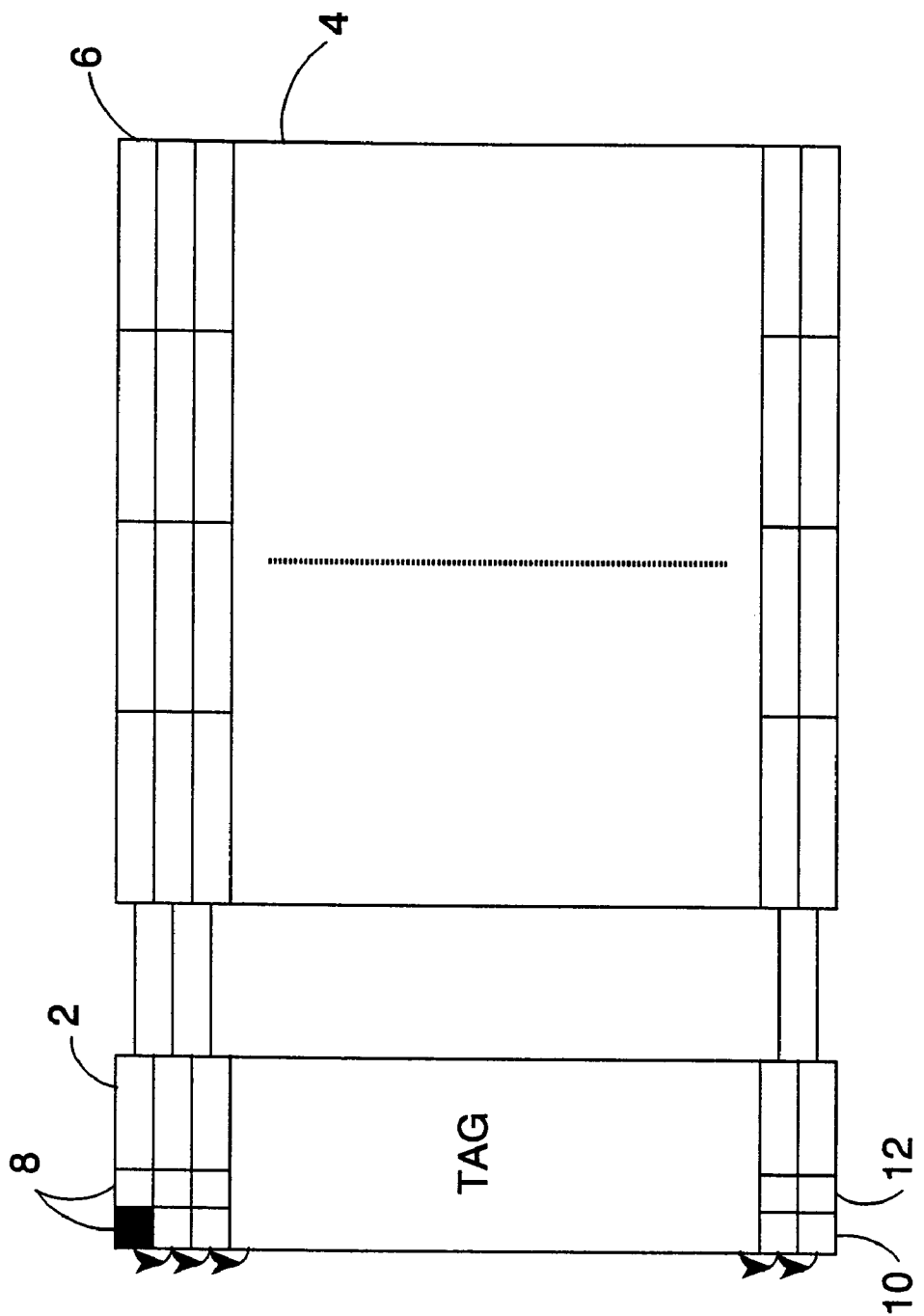
FIG. 1 illustrates a known cache system with individual status bits for each cache line.
Figure 2:
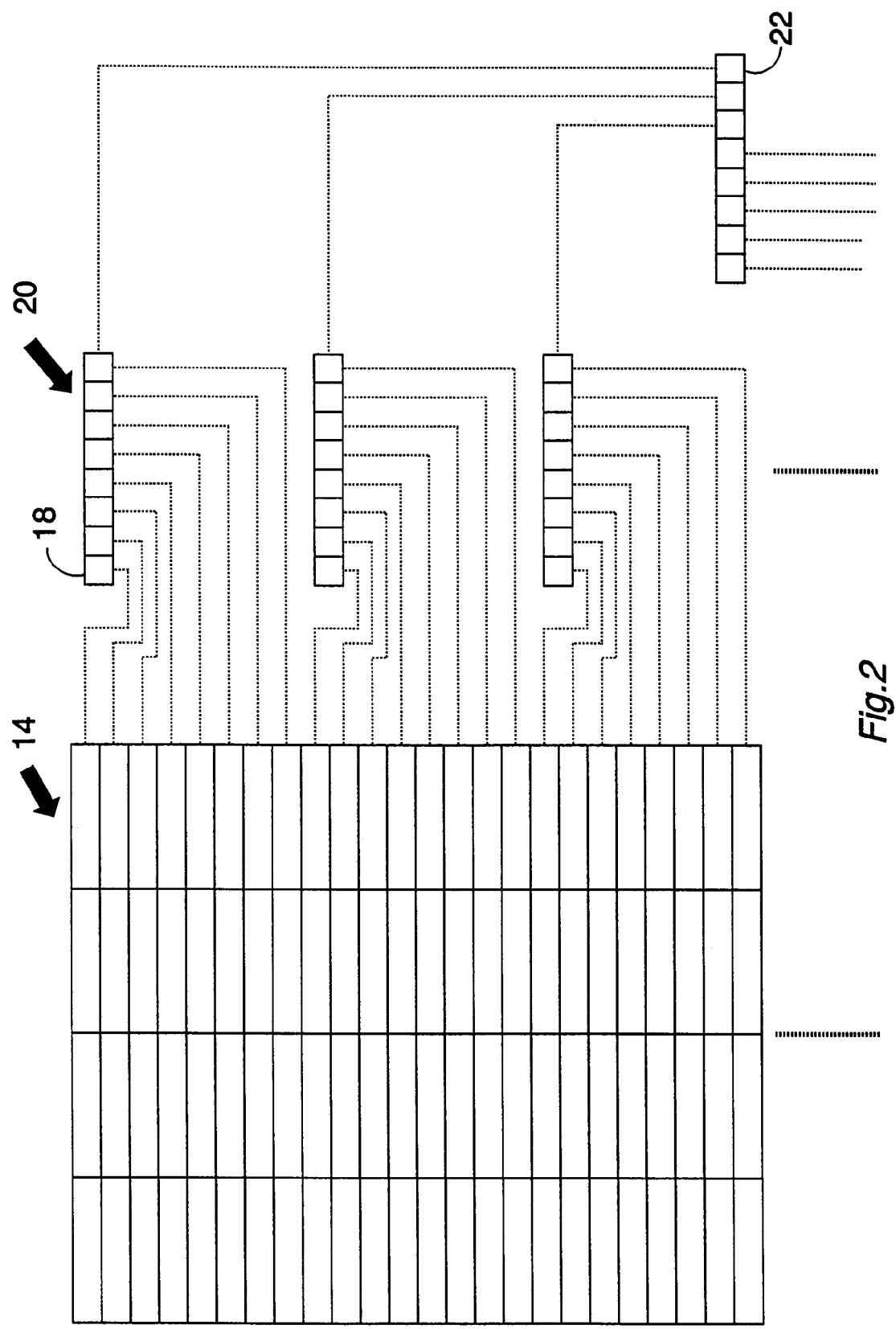
FIG. 2 illustrates a cache status bit store and the status bits associated therewith in a hierarchical relationship.

FIG. 2 shows a cache data word memory 14 composed of a plurality of cache lines 16 each storing four data words. A single valid bit 18 is associated with each cache line 16. The valid bits for eight successive cache lines 16 are stored within a single status bit word 20 stored within a status bit RAM memory. The status bit words 20 comprise the lowest level within the hierarchical relationship storing the status bits.

Each status bit word 20 is associated with a status bit 22 stored at a higher level within the hierarchical relationship and indicating the combined status of all of the status bits 18 within the status word 20. Thus, the status of eight status words 20 can be indicated by the eight bits 22 of a status word within the next highest level of the hierarchical relationship. This next higher level could itself be provided within status bit RAM memory or at some level towards the top of the hierarchical relationship it starts to become more efficient to provide the status bits storage with latches (register bits) that can be altered at relatively high speed using dedicated logic. Further levels may be provided above the two levels illustrated.

Figure 3:
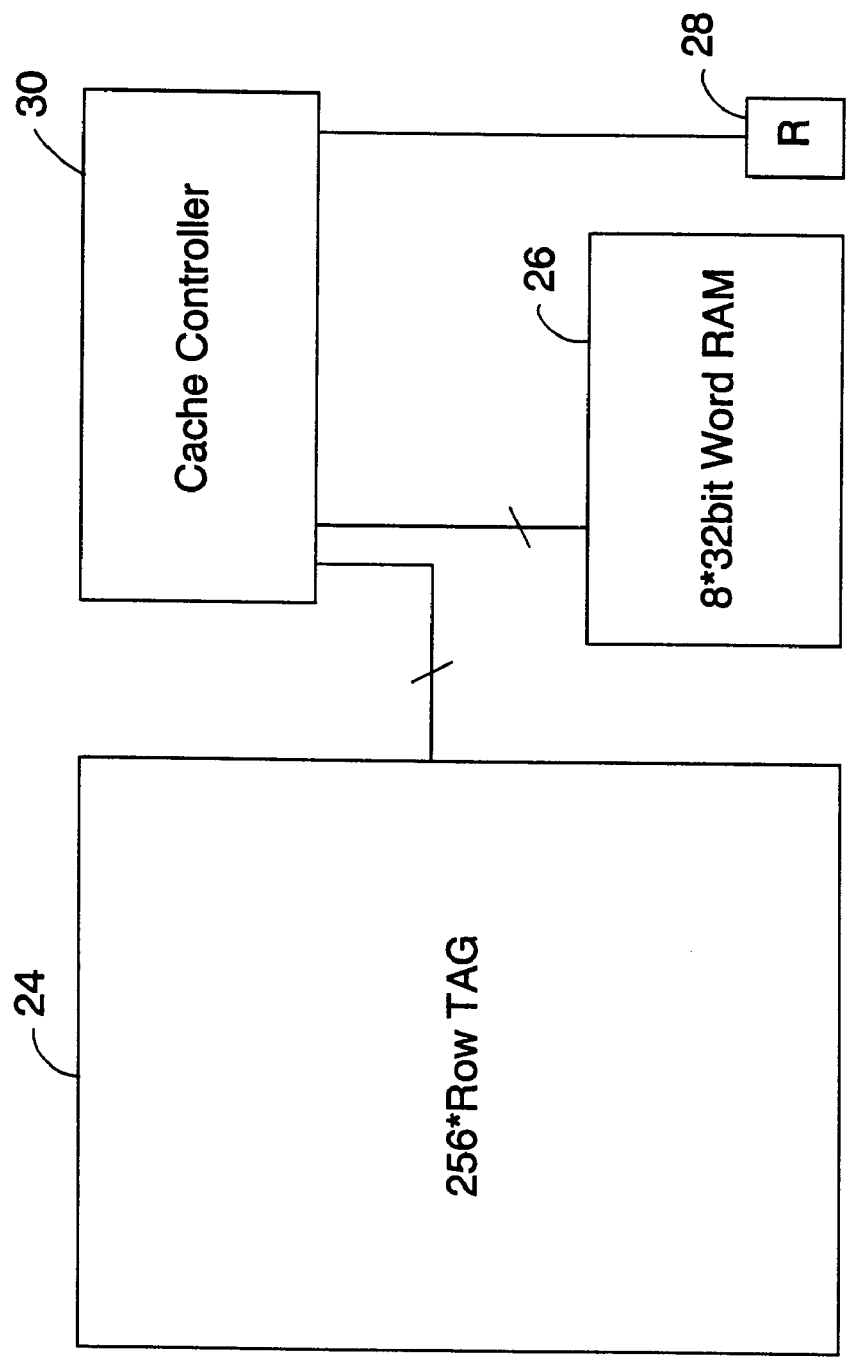
FIG. 3 schematically illustrates a part of a cache system for handling cache line TAG values and status bits.

FIG. 3 illustrates a portion of a cache memory system for storing cache row TAG values and associated status bits. If the cache has 256 cache rows, then a 256-row TAG store 24 is provided to store the associated TAG values for each cache row. Assuming each cache row has only a single status bit (e.g. a valid bit), then the status bits for these 256-cache rows can be stored within eight 32-bit words contained within a status bit RAM memory 26. The 32-bit words represent the lowest level within the hierarchical relationship storing the status bits. The next highest level within the hierarchical relationship (and in this example the highest level), is provided by an 8-bit register 28 with each bit of the register 28 representing the combined status of one of the 32-bit status bit words within the status bit RAM memory 26.

A cache controller 30 is coupled to the TAG memory 24, the status bit RAM memory 26 and the status bit register 28. The cache controller 30 acts as status querying logic when an access is being made to a data word within the cache memory, as well as providing other functions. When an access to a data word is requested, the cache controller 30 examines the status bits stored within the status bit register 28 and the status bit RAM memory 26. If at the highest level the bit within the status bit register 28 corresponding to the particular data word at the lowest level indicates that the data word is valid, then the cache controller 30 proceeds to then check the individual bit for that data word (cache row), within the status bit RAM memory 26. If the bit within the status bit register 28 indicates invalidity, then the status bit RAM memory 26 need not be checked (although the check may in fact be performed in parallel) since the invalidity indicated at the higher level overrides anything represented at the lower level.

The cache controller 30 is able to make high speed accesses to the status bits within the status bit register 28 such that all of the bits within this status bit register 28 can be set to indicate invalidity in a single cycle, e.g. as required in a rapid cache flush. The status bit words within the status bit RAM memory 26 can be accessed by a read-modify-write operation as required to make fine changes to the status bits at this lowest level within the hierarchical relationship. Alternatively separate read and write operations may be performed.

Figure 4:
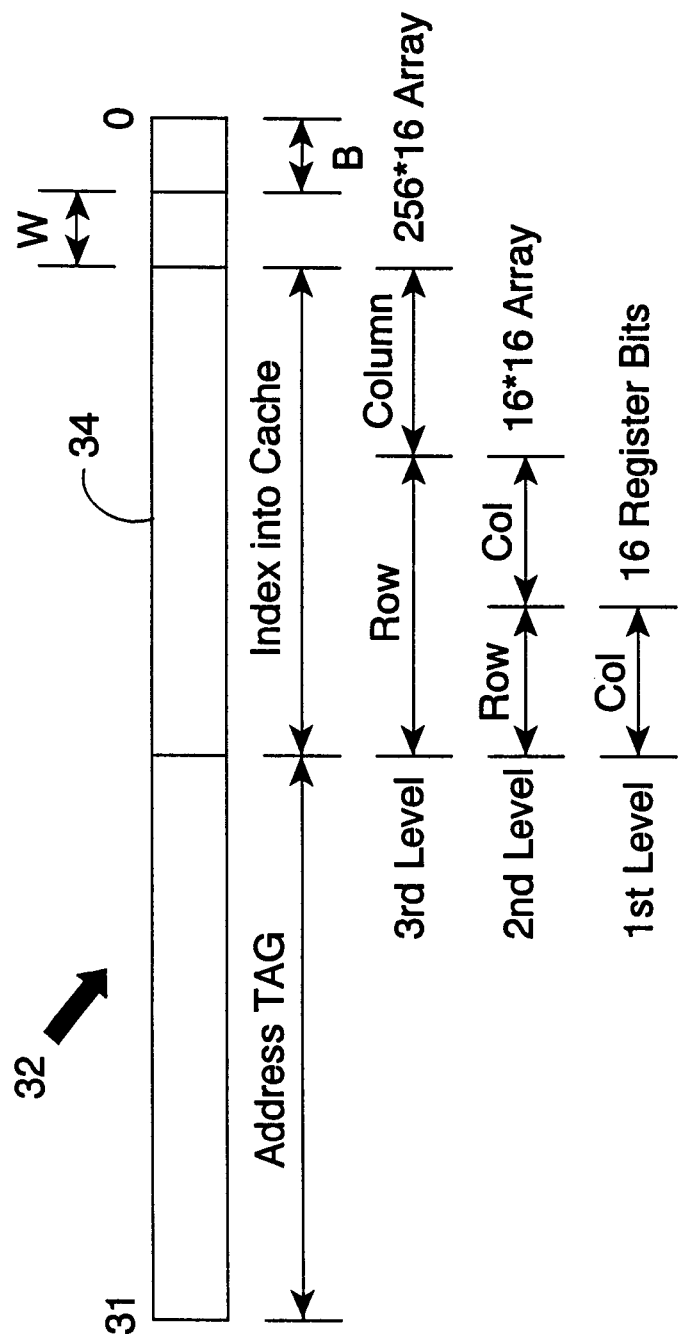
FIG. 4 illustrates for an example cache architecture the relationship between the address bits of a data word and the status bits for that data word within a hierarchical relationship of status bits.

FIG. 4 illustrates an example of how the address of a data word within a 128 kB cache that has four data words per line and is direct mapped may be related to the status bits and other control data.

The upper portion of the address 32 forms the TAG value that is compared with the TAG value stored within the TAG memory 24 to determine whether that particular data is cached. As the cache is direct mapped, a middle portion 34 of the address provides an index into the cache to indicate the TAG memory position that will store the TAG value if that data is present within the cache. At the lower end of the address, word bits W and byte bits B indicate which word position within a cache row is addressed, and which byte position within a data word if byte addressing permitted.

The status bit information for this cache memory is stored within a three-level hierarchy. Status bits are stored for each cache row and accordingly there is a status bit associated with each index value. These index value status bits can be stored within a 256*16 array formed of compiled RAM memory. Each line within the third level array has a corresponding status bit within the second level of the hierarchical relationship that is itself stored within a 16*16 array. This 16*16 array may also be stored within compiled RAM memory. The highest level (first level) within the hierarchical relationship is provided by 16 register bits, with one register bit corresponding to each array row of the second level.

Figure 5:
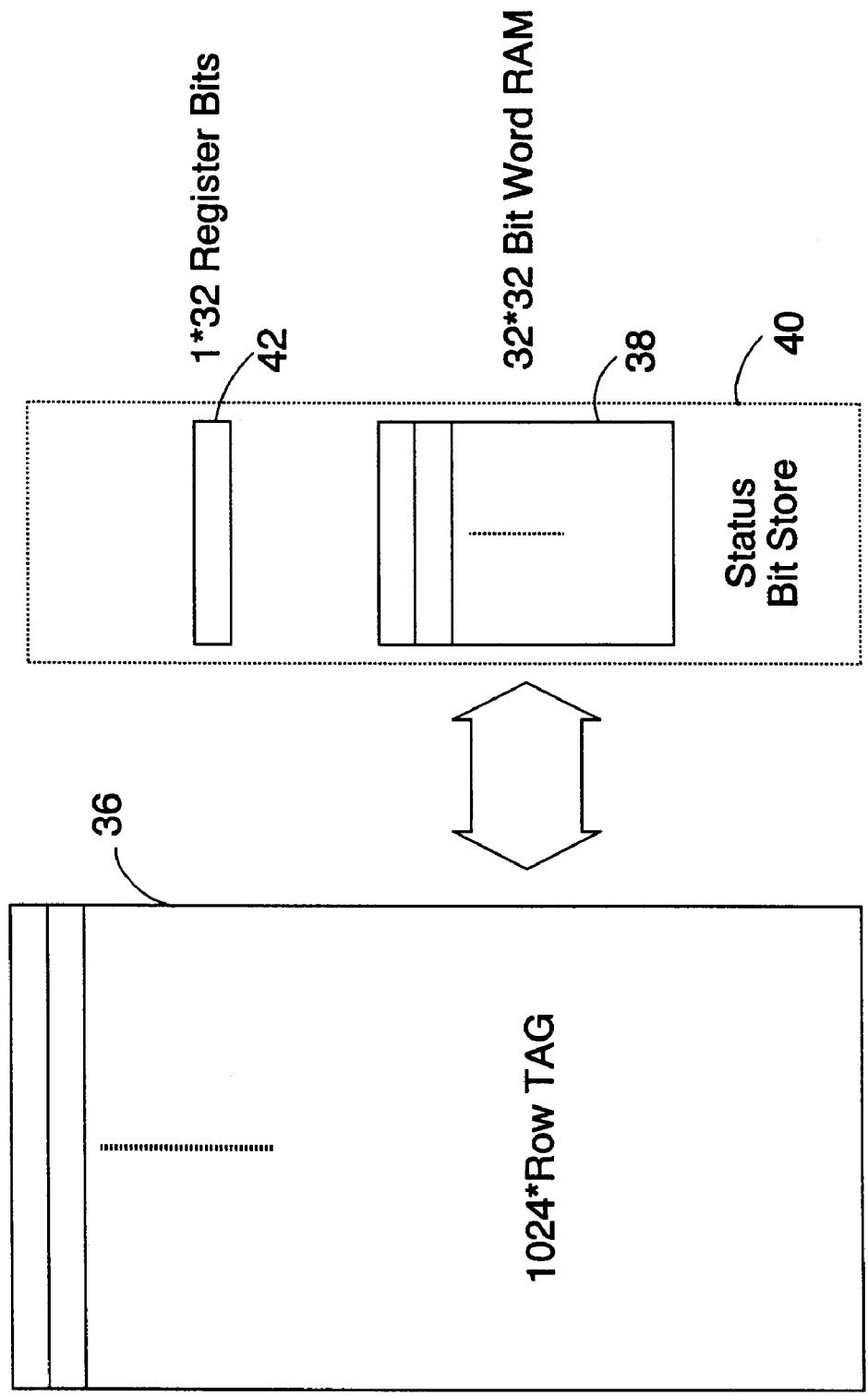
FIG. 5 illustrates another embodiment of a portion of a cache memory system.

FIG. 5 illustrates a further cache memory structure by way of example. In this example, a 1024-row TAG memory 36 is provided to store TAG values. Each row within the TAG memory 36 corresponds to a cache row and has a status bit associated with it. Accordingly, the status bits for 1024 cache rows can be stored within a 32*32 bit word RAM 38 that forms part of the status bits store 40. This status bit RAM memory 38 is the lowest level within the hierarchical relationship. The highest level within the hierarchical relationship is provided by 32 register bits 42 with one register bit corresponding to each 32-bit word within the status bit RAM memory 38.

By way of further illustration, the steps involved in various operations manipulating data words stored within a cache memory system incorporating a hierarchical relationship of status bits may be as follows:

Check Status:
read appropriate bits from all levels of the hierarchy
work down the hierarchy checking that each next lower level is valid
if any level indicates that lower levels are invalid, then return the default (reset) value
otherwise, return the value fetched from the lowest level valid store.

The status bits have two states. In the case of the valid bit, there is a reset state, which is invalid, and a valid state. To mark something as valid one must mark all the levels in the hierarchy. The reset state can be considered a strong state which can be indicated by a high level bit and the other state a weak state for which all the bits in the hierarchy have to be in agreement.

In a system storing multiple state bits per location, then the higher levels of the hierarchy only need to contain a single bit to indicate the validity of lower levels in the hierarchy.

Write Status:
work down the hierarchy setting appropriate bits to indicate that the next level down is valid
when a new line (at any level in the hierarchy) which was previously invalid is marked as valid the complete line must be initialized with the reset value, except for the value being written
in the case where a line was previously valid, then a read-modify-write operation is required to update the appropriate bits only
at the lowest level of the hierarchy the appropriate data should be written, and if necessary the other status bits written to their reset value.

Reset Status:
the highest level of status bits should be reset to mark the entire hierarchy as invalid.

In a cached system the read-modify-write operation may be spread across many cycles. Some interesting options that this raises are:
you only need maintain a hierarchy of valid bits, regardless of how many bits of status you keep at the lowest level (e.g. four valid bits+dirty+other status bits), i.e. different levels within the hierarchy can store different status bits.
if you do this, then the logic which reads the arrays needs to return the 'reset' state if an invalid location is accessed.
rather than maintaining just the valid bit hierarchy it might be beneficial to track other state through the hierarchy. For example, maintain both a valid and a dirty hierarchy—this would allow one to more rapidly search for dirty cache locations.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for data processing, said apparatus comprising:
   (i) a memory operable to store a plurality of data words, each data word being associated with at least one status bit giving information regarding a status of said data word;
   (ii) a status bit store operable to store said status bits within a hierarchical relationship such that a combined status relating to a plurality of first level status bits at a first level within said hierarchical relationship is indicated by a second level status bit at a second level within said hierarchical relationship, said second level being higher in said hierarchical relationship than said first level; and (iii) status querying logic operative to determine a status of a data word within said memory by examining status bits within said status bit store starting at a top level within said hierarchical relationship and working down through said hierarchical relationship until a status bit is reached that indicates said status of said data word independently of any status bits lower in said hierarchical relationship.

2. Apparatus as claimed in claim 1, wherein said status bits are valid bits indicative of validity of data words stored within said memory.

3. Apparatus as claimed in claim 1, wherein at a lowest level within said hierarchical relationship a lowest level status bit relates to a plurality data words stored within said memory.

4. Apparatus as claimed in claim 1, wherein said memory is a cache memory.

5. Apparatus as claimed in claim 4, wherein said cache memory comprises a plurality of cache rows, each cache row storing a plurality of data words, and a lowest level status bit relates to all data words within a cache row of said cache memory.

6. Apparatus as claimed in claim 1, wherein said status bit store includes a RAM memory storing status bit words formed of a plurality of status bits.

7. Apparatus as claimed in claim 6, wherein status bits within said status bits words are accessed and manipulated as part of said status bit words.

8. Apparatus as claimed in claim 7, wherein a status bit is manipulated by a status word read-modify-write operation upon said RAM memory.

9. Apparatus as claimed in claim 1, wherein said status bit store includes at least a highest level within said hierarchical relationship at least one register bit circuit operable to store a status bit.

10. Apparatus as claimed in claim 9, wherein a status bit stored within a register bit may be individually accessed and manipulated.

11. Apparatus as claimed in claim 1, wherein a highest level within said hierarchical relationship comprises a single status bit.

12. Apparatus as claimed in claim 1, wherein a global change in status of all data words stored within said memory can be indicated by modifying only those status bits within a highest level of said hierarchical relationship.

13. Apparatus as claimed in claim 1, wherein said status bit store is operable such that a global change in status of all data words within said cache memory can be provided in a single processing cycle by a change to highest level status bits within said hierarchical relationship.

14. Apparatus as claimed in claim 4, wherein a global change in status of all data words within said cache memory is made in response to one of:

(i) a cache memory flush operation;

(ii) a change in configuration of a memory management unit controlling access to said data words; and (iii) a context switch of an operating system controlling software operations upon said apparatus.

15. Apparatus as claimed in claim 4, wherein data words are stored into said cache memory using a cache fill operation lasting for a plurality of processing cycles and said status bit store is operable to modify status bits relating to said data words being stored into said cache memory during said plurality of processing cycles.

16. Apparatus as claimed in claim 1, wherein said hierarchical relationship is three or more levels deep.

17. Apparatus as claimed in claim 1, wherein different levels within said hierarchical relationship store different status bits.

18. A method of processing data, said method comprising the steps of:

(i) storing a plurality of data words within a memory, each data word being associated with at least one status bit giving information regarding a status of said data word;

(ii) storing said status bits within a hierarchical relationship such that a combined status relating to a plurality of first level status bits at a first level within said hierarchical relationship is indicated by a second level status bit at a second level within said hierarchical relationship, said second level being higher in said hierarchical relationship than said first level; and (iii) determining a status of a data word within said memory by examining status bits starting at a top level within said hierarchical relationship and working down through said hierarchical relationship until a status bit is reached that indicates said status of said data word independently of any status bits lower in said hierarchical relationship.

* * * * *